US012448870B2

(12) United States Patent
Marya et al.

(10) Patent No.: US 12,448,870 B2
(45) Date of Patent: Oct. 21, 2025

(54) CARBON RICH LAYER FOR SCALE CONTROL

(71) Applicant: Schlumberger Technology Corporation, Sugar Land, TX (US)

(72) Inventors: Manuel Marya, Sugar Land, TX (US); Virendra Singh, Sugar Land, TX (US); Alireza Zolfaghari, Rosharon, TX (US)

(73) Assignee: Schlumberger Technology Corporation, Sugar Land, TX (US)

( * ) Notice: Subject to any disclaimer, the term of this patent is extended or adjusted under 35 U.S.C. 154(b) by 0 days.

(21) Appl. No.: 18/720,437

(22) PCT Filed: Mar. 7, 2022

(86) PCT No.: PCT/US2022/019084
§ 371 (c)(1),
(2) Date: Jun. 14, 2024

(87) PCT Pub. No.: WO2023/172236
PCT Pub. Date: Sep. 14, 2023

(65) Prior Publication Data
US 2025/0084735 A1 Mar. 13, 2025

(51) Int. Cl.
*E21B 41/02* (2006.01)
*C09D 1/00* (2006.01)
(Continued)

(52) U.S. Cl.
CPC ................ *E21B 41/02* (2013.01); *C09D 1/00* (2013.01); *C09D 5/1618* (2013.01);
(Continued)

(58) Field of Classification Search
CPC ............................... E21B 41/02; E21B 34/066
See application file for complete search history.

(56) References Cited

U.S. PATENT DOCUMENTS 8,286,715 B2 * 10/2012 Bailey ................. E21B 17/1085 166/380
8,561,707 B2 * 10/2013 Jin .......................... E21B 41/00 166/380
(Continued)

FOREIGN PATENT DOCUMENTS

CN 102286719 A * 12/2011
CN 102286726 A * 12/2011
(Continued)

OTHER PUBLICATIONS

Best Stainless & Alloys, "Mechanical Properties", undated, https://www.beststainless.com/mechanical-properties.html, 6 pages (Year: 2025).*

*Primary Examiner* — Jennifer H Gay
(74) *Attorney, Agent, or Firm* — Jeffrey D. Frantz

(57) ABSTRACT

A system may include a substrate having a tensile strength of at least 10,000 PSI at an ambient temperature. The system may also include a carbon rich layer deposited on the substrate, wherein the carbon rich layer comprises at least one of a carbide, a nitride, a boride, a silicide, an oxide, a sulfide, or a transition-metal or non-metal ceramic-forming element, wherein the carbon rich layer comprises a carbon content including $sp^2$ carbon and $sp^3$ carbon, wherein the carbon content has greater than 40% $sp^3$ carbon, a $sp^2/sp^3$ ratio of the carbon content is less than 1.5, or both. The carbon-rich layer is designed to reduce or prevent the formation of adherent scales on flow system surfaces used in well production, fluid injection or gas sequestration, and includes electrically-actuated downhole components having dynamic sliding surfaces.

15 Claims, 10 Drawing Sheets

(51) Int. Cl.

| | |
|---|---|
| ***C09D 5/16*** | (2006.01) |
| ***C23C 16/32*** | (2006.01) |
| ***C23C 16/50*** | (2006.01) |
| ***E21B 34/06*** | (2006.01) |

(52) U.S. Cl.

CPC ............ *C23C 16/325* (2013.01); *C23C 16/50* (2013.01); *E21B 34/066* (2013.01)

(56) References Cited

U.S. PATENT DOCUMENTS

| | | | | | |
|---|---|---|---|---|---|
| 8,590,627 | B2 * | 11/2013 | Jin | E21B 41/00 | 166/380 |
| 8,631,864 | B2 * | 1/2014 | Saenger | E21B 17/1064 | 175/371 |
| 9,404,334 | B2 * | 8/2016 | Mazyar | E21B 49/082 | |
| 9,534,476 | B2 * | 1/2017 | Kumar | E21B 17/00 | |
| 11,643,730 | B2 * | 5/2023 | Marya | C23C 18/165 | 428/681 |
| 12,157,939 | B2 * | 12/2024 | Bolvardi | C23C 14/3407 | |
| 2008/0166287 | A1 * | 7/2008 | Venkatraman | C23C 28/322 | 423/446 |
| 2008/0236842 | A1 * | 10/2008 | Bhavsar | E21B 41/02 | 166/381 |
| 2010/0044110 | A1 * | 2/2010 | Bangru | E21B 17/1085 | 175/320 |
| 2010/0206553 | A1 * | 8/2010 | Bailey | E21B 17/1085 | 166/243 |
| 2011/0042069 | A1 * | 2/2011 | Bailey | E21B 17/1085 | 166/243 |
| 2011/0061945 | A1 * | 3/2011 | Saenger | E21B 17/1064 | 427/331 |
| 2011/0203791 | A1 * | 8/2011 | Jin | E21B 17/042 | 166/244.1 |
| 2011/0220348 | A1 * | 9/2011 | Jin | E21B 41/00 | 166/244.1 |
| 2011/0220415 | A1 * | 9/2011 | Jin | C23C 14/024 | 175/320 |
| 2014/0060811 | A1 * | 3/2014 | Mazyar | F16J 15/104 | 166/118 |
| 2015/0147495 | A1 * | 5/2015 | Kumar | B32B 1/00 | 428/408 |
| 2018/0298483 | A1 * | 10/2018 | Vieluf | H01M 4/663 | |
| 2020/0407852 | A1 * | 12/2020 | Marya | C25D 3/04 | |
| 2022/0136096 | A1 * | 5/2022 | Bolvardi | C23C 28/36 | 428/457 |
| 2024/0049385 | A1 * | 2/2024 | Zolfaghari | H05K 1/09 | |
| 2025/0084735 | A1 * | 3/2025 | Marya | E21B 41/02 | |
| 2025/0145848 | A1 * | 5/2025 | Bhudolia | C09D 167/00 | |

FOREIGN PATENT DOCUMENTS

| | | | | | |
|---|---|---|---|---|---|
| CN | 110184564 | A * | 8/2019 | | |
| CN | 118186363 | A * | 6/2024 | | |
| EP | 2090741 | A1 * | 8/2009 | E21B 17/1064 | |
| JP | 4730753 | B2 * | 7/2011 | C23C 14/0605 | |
| JP | 5227782 | B2 * | 7/2013 | C23C 14/024 | |
| WO | WO-2011103551 | A1 * | 8/2011 | E21B 17/1085 | |
| WO | WO-2011104876 | A1 * | 9/2011 | F01C 17/066 | |
| WO | WO-2023172236 | A1 * | 9/2023 | C23C 16/0281 | |

* cited by examiner

128

CARBON RICH LAYER FOR SCALE CONTROL

CROSS-REFERENCE TO RELATED APPLICATION

This application is a national stage entry under 35 U.S.C. 371 of International Application No. PCT/US2022/019084, filed Mar. 7, 2022.

BACKGROUND

The subject matter disclosed herein relates to carbon rich layers configured to reduce or prevent the formation of adherent scales on flow system surfaces, that is resilient solid deposits that can interfere with otherwise normal scale-free flow.

A variety of equipment and in general systems may be subject to scale formation. The equipment may include oil and gas equipment used for the extraction of hydrocarbons (e.g., oil and/or gas) from a well. The equipment also may include sequestration equipment configured to inject and store fluids (e.g., liquid water, steam, gases such as carbon dioxide, hydrogen, methane, and the like) in subterranean reservoirs. For example, the sequestration equipment may include carbon capture and storage (CCS) equipment. The foregoing equipment (e.g., downhole component) may include, for example, tubing, valves, chokes, packers, pumps, or other associated equipment. Unfortunately, the foregoing equipment may be operated in the presence of organic and inorganic scale-forming fluids, particularly fluids containing salts with anions such as carbonates, sulfide, oxides, hydroxides, and sulfates. In certain environmental conditions, such as when the scale-forming fluids undergo changes in temperature, pressure, and/or chemical equilibria, the salts may precipitate and form scales, that is more or less adherent solid deposits on the foregoing equipment surfaces. The scale deposits may in turn progressively decrease the performance of the foregoing equipment, such as by reducing or restricting the fluid flow, or by preventing a mechanical component to properly slide and actuate.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In certain embodiments, a system includes a substrate having a tensile strength of at least 10,000 psi at an ambient temperature. The system also includes a carbon rich layer deposited on the substrate. The carbon rich layer comprises at least one of a carbide, a nitride, a boride, a silicide, an oxide, a sulfide, or a transition-metal or non-metal ceramic-forming element. The carbon rich layer also comprises a carbon content including $sp^2$ carbon and $sp^3$ carbon. The carbon content has greater than 40 percent $sp^3$ carbon, a $sp^2/sp^3$ ratio of the carbon content is less than 1.5, or both.

In certain embodiments, a system includes a substrate having a tensile strength of at least 10,000 psi at an ambient temperature. The system also includes a carbon rich layer applied to the substrate. The carbon rich layer includes a first portion having a first carbon content. The carbon rich layer also includes a second portion comprising at least one of a carbide, a nitride, a boride, a silicide, an oxide, a sulfide, or a transition-metal or non-metal ceramic-forming element. The second portion also comprises a second carbon content different from the first carbon content. The second carbon content includes $sp^2$ carbon and $sp^3$ carbon. The carbon content has greater than 40 percent $sp^3$ carbon, a $sp^2/sp^3$ ratio of the carbon content that is less than 1.5, or both.

In certain embodiments, system includes a downhole component formed of a material having a tensile strength of at least 10,000 psi at an ambient temperature. The system also includes a carbon rich layer deposited on the downhole component. The carbon rich layer comprises at least one of a carbide, a nitride, a boride, a silicide, an oxide, a sulfide, or a transition-metal or non-metal ceramic-forming element. The carbon rich layer also comprises a carbon content including $sp^2$ carbon and $sp^3$ carbon. The carbon content has greater than 40 percent $sp^3$ carbon, a $sp^2/sp^3$ ratio of the carbon content that is less than 1.5, or both.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
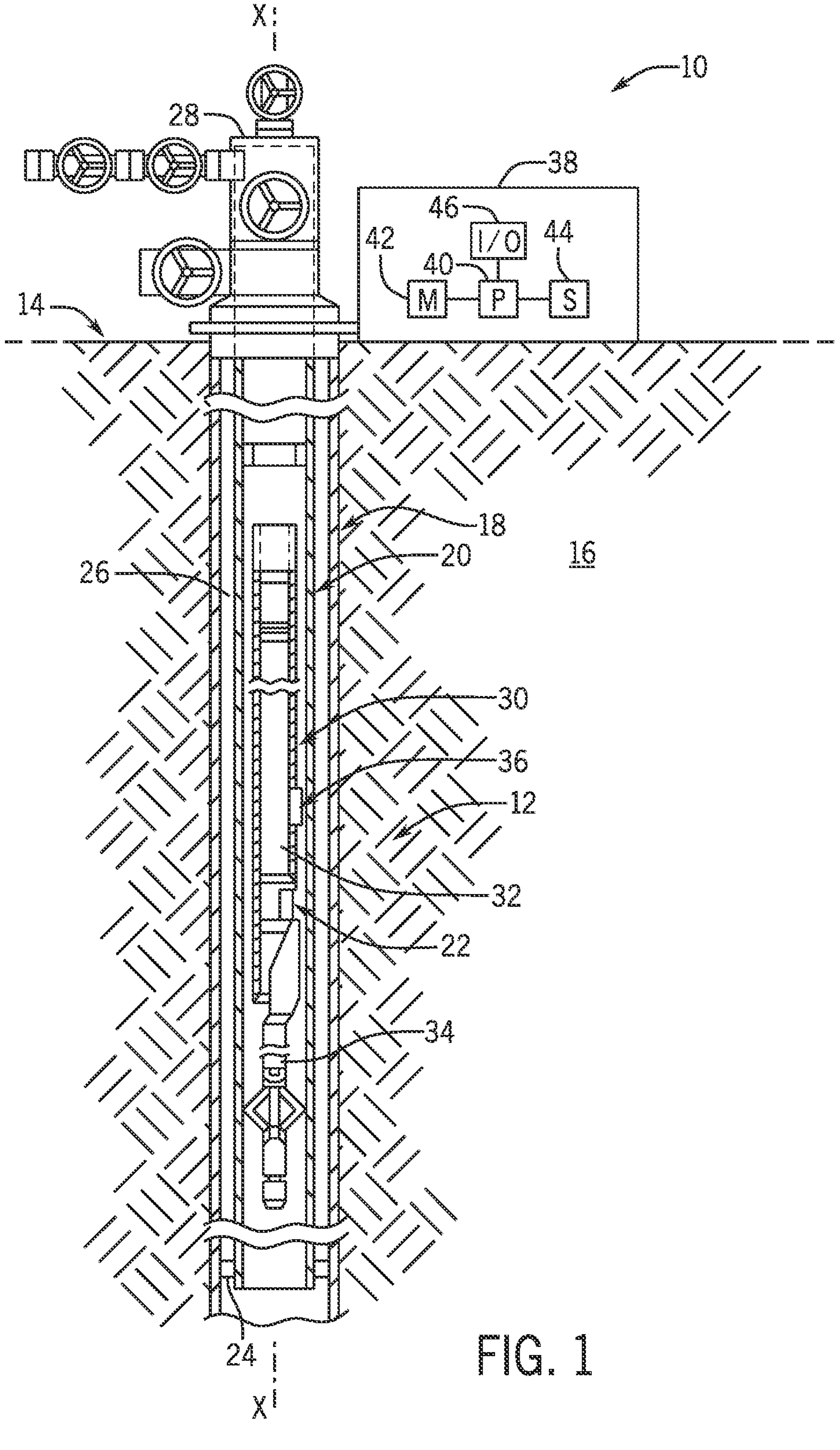
FIG. 1 is a schematic diagram of a wellsite where a carbon rich layer may be employed, in accordance with the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

As generally discussed above, downhole components (e.g., tubing, valves, packers, pumps, etc.) operated in the presence of scale-forming fluids may develop scale deposits due to the changes in properties of the downhole environment (e.g., changes in temperature, pressure, and/or chemical equilibria). Scale deposits on or within the downhole component, such as a valve, may prevent or block a desired flow of a downhole fluid out of or into a downhole tool. Scale deposits, such as those that are highly adherent to the substrate, may prevent a mechanical component from properly actuating (e.g., a piston tube within a cylindrical pressure housing). Accordingly, a reduction or inhibition of the formation of scale deposits can improve both the longevity of these systems as well as general operational efficiency, whether for oil and gas production, water or gas injection, carbon dioxide sequestration or geothermal applications.

The present disclosure is directed to techniques for scale reduction or inhibition on a downhole component by applying a material coating having at least one carbon rich layer to the downhole component exposed to scale-forming fluids. Again, the downhole component may include valves, chokes, pumps, packers, or other fluid control equipment. In general, the carbon rich layer may include one or more carbon regions and one or more additional chemical components (e.g., metallic sources and/or nonmetallic sources), such as one or more of a carbide, nitride, sulfide, silicide, or oxide. The carbon region may include a suitable amount of $sp^2$ and $sp^3$ carbon to produce desired combinations of properties among friction coefficient, surface hardness, contact angles, all generally having positive impacts for reducing a likelihood of scale precipitation (e.g., scale formation) on the surface of a coating. Carbon is stabilized in various multi-atomic structures with diverse atomic arrangements or configurations referred as allotropes: these includes amorphous carbon (a-C), graphite (with $sp^2$ configuration) and tetrahedral amorphous carbon (ta-C) or defected diamond (with $sp^3$ configuration). Carbon-rich layers include these allotropes in various proportions, among carbon and non-carbon phases. It is presently recognized that providing a carbon rich layer having greater than 40% $sp^3$ carbon may reduce the amount of scaling as compared to a carbon rich layer including less than 40% $sp^3$ carbon. For example, the carbon rich layer may have greater than 40, 45, or 50% $sp^3$ carbon as generally measured by X-ray photoelectron spectroscopy. Additionally, the carbon rich layer may have a $sp^2/sp^3$ ratio less than 1.5 to help reduce the amount of scaling. For example, the carbon rich layer may have a $sp^2/sp^3$ ratio less than 1, 1.1, 1.2, 1.3, 1.4, or 1.5 to tailor a number of layer properties, including propensity towards scaling. Accordingly, in the presence of scale-forming fluids, a downhole component at least partially or completely covered with the carbon rich layer may be utilized for longer periods of time, because the carbon rich layer substantially reduces or inhibits the scale formation on the downhole component and thus helps to avoid any constraints to fluid flow (e.g., blockages or restrictions caused by the scale formation). While reduction if flow rates due to scaling is a major concern, interference with the proper functioning of downhole system creates major system reliability concerns, particularly with systems that rely less on hydraulic power and more on electrical power.

With the foregoing in mind, FIG. 1 illustrates a well closure system 10 that may utilize the disclosed carbon rich layer. It should be noted that although the discussion of FIG. 1 relates to a well closure system, embodiments of the present disclosure may be utilized in any subsurface application where hydrocarbons are produced and injection systems where liquid water, steam, gases such as carbon dioxide, hydrogen, methane, or other fluids such as supercritical carbon dioxide or mineral-rich brines are sequestered or produced from a surface or subsea. In a well closure system, one or multiple closure devices 12 (e.g., for plugging a well) may be lowered into a wellbore 14 (e.g., installed and anchored within the wellbore 14) prior to certain operations, such as well production. The closure device 12 may be lowered into the wellbore 14 as a first installation, to replace a previously installed closure device 12, or to add an additional closure device 12. In any case, the closure device 12 is configured to control flow from the reservoir such that it only goes in at the specific manage points (e.g., perforations, valves, and the like). For example, the closure device 12 may block a flow of formation fluid from reaching a surface located above a geological formation 16 (e.g., via conduits such as a casing conduit 18 and/or a production casing conduit 20), which flow may result from high pressure conditions that arise during well production. The closure device 12 may include a valve 22, such as a subsurface valve. For example, the valve 22 may include a gate valve, a ball valve, a linear piston valve, check valve, or any combination thereof. As shown in this configuration of the wellbore 14, the wellbore completion includes a casing conduit 18 and a production casing conduit 20 (e.g., production tubing) with an annular sealing element 24 (e.g., metal and/or elastomeric seal) that seals an annular space 26 defined between the casing conduit 18 and the production casing conduit 20. The wellbore 14 may include a wellhead 28 at the surface of the well closure system 10 that may selectively seal the casing conduit 18 and/or the production casing conduit 20.

In the illustrated example of FIG. 1, the closure device 12 includes a valve housing 30 having a valve 22, an actuation subsystem 32 (e.g., an actuator), and a valve controller 34. The closure device 12 is sealed in the production tubing by a sealing element, so that the fluid may not reach the surface if it does not pass through the valve 22. In certain embodiments, the valve 22 may include a gate valve, a ball valve, or another suitable valve configured to open and close the fluid flow. For example, the valve 22 may include a flapper that can switch between an open position to enable fluid flow and a closed position to block the fluid flow. The actuation subsystem 32 may include an electric actuator, a fluid-driven actuator (e.g., a hydraulic actuator), a mechanical actuator (e.g., a hand wheel), a spring biasing element (e.g., a mechanical spring) configured to bias the valve to an open or closed position, or any combination thereof. For example, the actuation subsystem 32 includes a biasing component 36 (e.g., a pressurization piston coupled to a mechanical spring) to maintain the valve 22 in a default position (e.g., open or closed). The valve controller 34 is configured to control and/or adjust a position of components of the closure device 12 (e.g., the valve 22) via the actuation subsystem 32 to block the flow of formation fluid from reaching the surface or to enable the fluid to flow toward the surface. In certain embodiments, the valve 22 and/or one or more additional valves may be used to control fluid flow from the surface to a downhole location, such as by injecting one or more fluids such as water, carbon dioxide, hydrogen, among others.

It should be noted that the actuation subsystem 32 and the valve housing 30 may be configured to operate with or without use of fluid or electrical control lines extending from the surface into the wellbore 14. For example, electrical power and/or fluid pressure may be provided from the surface using one or more electrical generators, a power grid, batteries, pumps, or a combination thereof. Additionally, or alternatively, the actuation subsystem 32 may be powered by one or more local power supplies, such as a battery pack, at the location of the valve 22.

The illustrated embodiment of the closure device 12 includes the valve controller 34 that may be utilized to adjust the position of the components in the valve housing 30. The valve controller 34 controls and/or adjusts a position of the valve 22 between open and closed positions (e.g., via the actuation subsystem 32). For example, the valve controller 34 may control and/or adjust the valve 22 based on messages that are transmitted by a transmitter of a transmitter subsystem 38.

In some embodiments, the transmitter subsystem 38 may receive sensor measurements (e.g., temperature sensor measurements, pressure sensor measurements, flow-rate sensor measurements, fluid composition measurements such as salinity levels, other parameters relating to the formation of scale deposits, or any combination thereof). The sensor measurements may be directed by surface sensors, downhole sensors, or completion sensors to the transmitter subsystem 38 via any suitable telemetry (e.g., via electrical signals pulsed through the geological formation 16 or via mud pulse telemetry). In some embodiments, the transmitter subsystem 38 may receive inputs from a user interface controlled by an operator. The transmitter subsystem 38 may process the sensor measurements and/or user inputs to determine a condition within the wellbore 14 or at the surface and determine whether to adjust the position of the valve 22 based on the condition of the wellbore 14 and/or the surface.

To this end, the transmitter subsystem 38 may be any electronic data processing system that can be used to carry out the systems and methods of this disclosure. For example, the transmitter subsystem 38 may include a processor 40 which may execute instructions stored in memory 42 and/or storage 44. As such, the memory 42 and/or the storage 44 of the transmitter subsystem 38 may be any suitable article of manufacture that can store the instructions. In some embodiments, the memory 42 is a tangible, non-transitory, machine-readable-medium that may store machine-readable instructions for the processor 40 to execute. The memory 42 may include ROM, flash memory, a hard drive, or any other suitable optical, magnetic, or solid-state storage medium, or a combination thereof. The memory 42 may store data, instructions, and any other suitable data. Additionally, the transmitter subsystem 38 may include an input/output (I/O) port 46, which may include interfaces coupled to various components such as input devices (e.g., keyboard, mouse), input/output (I/O) modules, sensors (e.g., surface sensors and/or downhole sensors), and the like. For example, the I/O port 46 may include a display (e.g., an electronic display) that may provide a visualization, a well log, or other operating parameters of the geological formation 16, the wellbore 14, or the surface to an operator, for example. In this embodiment, the transmitter subsystem 38 (e.g., data processing system) has been represented at the well site. However, all or part of the transmitter subsystem 38 (e.g., all or part of the processor, the display, the memory, etc.) may be situated remotely from the well site and configured to communicate with the well site via a network connection. It should be noted that, at least in some instances, all or part of the data processing system may be cloud-based.

Figure 2:
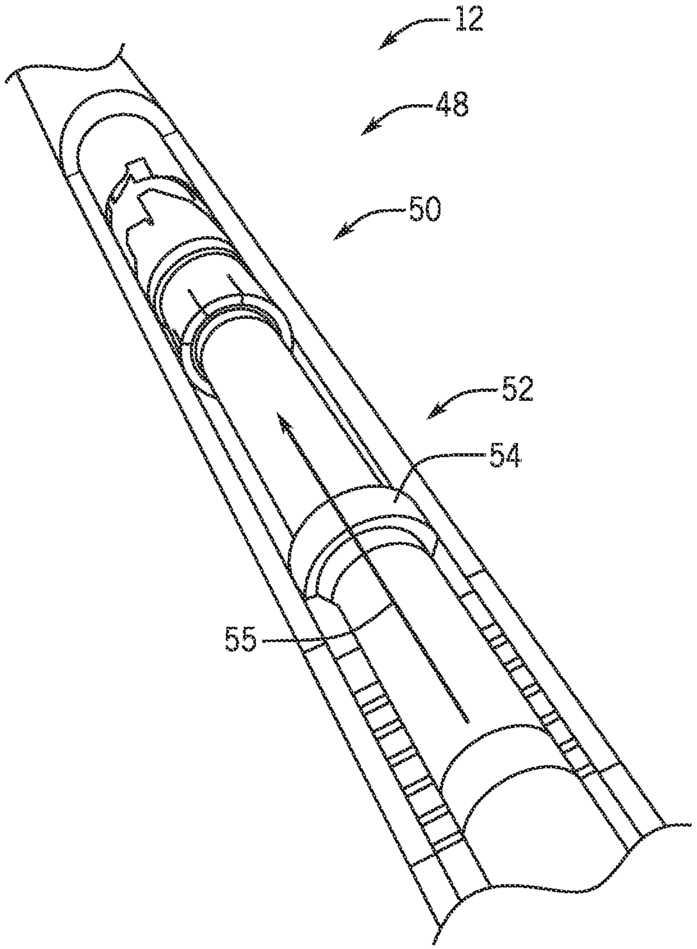
FIG. 2 is a perspective view of a downhole tool where the carbon rich layer may be employed, in accordance with the present disclosure.
Figure 3:
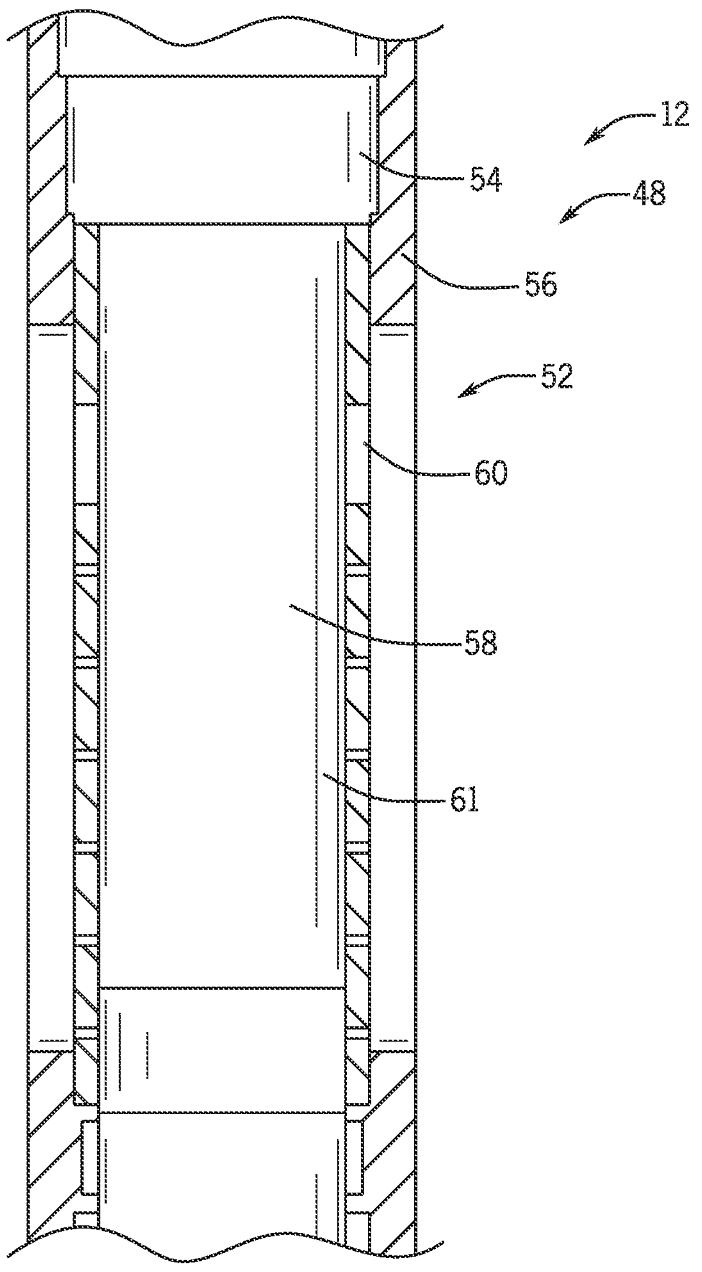
FIG. 3 is a cross-sectional view of the downhole tool of FIG. 2 where the carbon rich layer may be employed, in accordance with the present disclosure.

As discussed herein, a carbon rich layer may be applied to one or more surfaces of the downhole component to reduce, block, or generally inhibit the precipitation of scale onto surfaces of the downhole components, thereby reducing the possibility of blockage of fluid flow or the improper actuation of a mechanical component. FIGS. 2 and 3 show examples of downhole component to illustrate where it may be desirable to provide, apply, or deposit, the disclosed carbon rich layer.

FIG. 2 is a perspective view of an embodiment of the closure device 12, including a flow control valve 48. The illustrated embodiment of the flow control valve 48 includes an indexer section 50 and a choke section 52. Additionally, the illustrated embodiment of the flow control valve 48 includes a collet 54 disposed on the choke section 52 that may secure or maintain a position of the choke section 52, such as by blocking longitudinal movement (e.g., along the axis 55) of the choke within the closure device 12. The carbon rich layer may be applied to any internal and external surfaces of the closing devices 12, such as along an interior flow path through the flow control valve 48.

FIG. 3 is a cross-sectional view of the choke section 52 of the flow control valve 48 of FIG. 2. The choke section 52 includes a choke housing 56 that at least partially surrounds a piston 58 and controls longitudinal movement of the piston 58. In general, the carbon rich layer may be applied on one or more surfaces of the flow control valve 48, such as along an inner surface 60 of the choke housing 56, an outer surface 61 of the piston 58, an inner surface of the collet 54, and inner or outer surfaces (not shown) of the indexer section 50.

It should be noted that the above discussions of FIGS. 1-3 regarding suitable locations where the carbon rich layer may be applied is meant to be non-limiting. In general, the carbon rich layer may be applied to a surface of a substrate that may be exposed to scale-forming fluids, whether flowing in laminar or turbulent regimes, or the contrary stagnant. In some embodiments, the substrate may be a downhole component that facilitates the regulation of flow to or from a geological formation, such as sliding sleeves, chokes, ball valves, and flapper valves. In some embodiments, the substrate may be a surface (e.g., an inner surface and/or an outer surface) of a packer or a valve that is exposed to scale-forming fluids (e.g., carbonate containing fluids). It is presently recognized that it may be advantageous to apply the carbon rich layers on inner and/or outer surfaces of downhole components (e.g., the collet 54, the choke housing 56, the piston 58), wherein the downhole components rely on electrical actuation as compared to hydraulic pressure actuation. For example, downhole components that are electrically actuated (e.g., having flow regulation systems that are actuated electrically) may be more susceptible to reduced efficiency of operation due to scale build up as compared to downhole components that are actuated via hydraulic pressure. Accordingly, the disclosed carbon rich layer may improve the reliability of electrical actuation of downhole components, such as valves.

Furthermore, in embodiments where the disclosed carbon rich layer is applied onto a surface of a piston, it should be noted that the carbon rich layer may be configured to provide a relatively low friction coefficient under certain conditions, such as dry and lubricated conditions. For example, the carbon rich layer may be deposited on opposing surfaces or an entire circumference of multiple parts (e.g., a first part such as a piston and a second part such as a shaft including the piston) the downhole component. Additionally, the carbon rich layer may have a coefficient of friction less than approximately 0.30, 0.25, 0.20, 0.15, 0.10, 0.09, 0.08, 0.07, 0.06, or 0.05 against a metal under dry conditions, particularly alloys of iron, nickel, titanium. Example Alloys that may be used in accordance with the disclose techniques are included in certain standards such as ISO 15156, certain stainless steels, among martensitic stainless steels (e.g., 13Cr, modified 13Cr), duplex and superduplex stainless steels (22Cr, 25Cr) and nickel-based alloys such as Alloy 925, Alloy 718, among others. In certain applications, a polymer composite material that is non-interfering with downhole measurements; in others, a carbide component may be utilized to mitigate erosion. When applied to these components, the carbon rich layer may mitigate, prevent, or reduce scale formation as well as not reduce efficiency of operation of components that may be partially in contact during operation.

Figure 4:
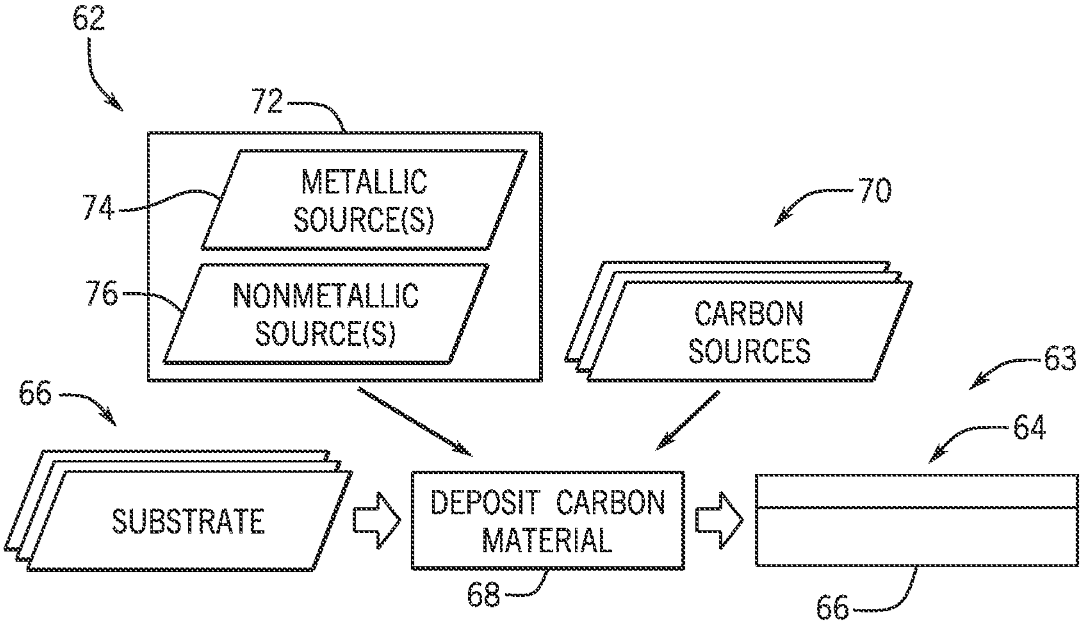
FIG. 4 is a flow diagram of a process for generating the carbon rich layer, in accordance with the present disclosure.

FIG. 4 is a flow diagram of an embodiment of a process 62 for producing a coating 63 having one or more carbon rich layers 64 on a substrate 66 of a component (e.g., a downhole component). As discussed herein, the carbon rich layer 64 may be applied to the inside or outside of the substrate 66, thereby helping to reduce the possibility of scale formation on the substrate 66 of the component and to provide a sufficiently low coefficient of friction on the surface of the component to maintain acceptable efficiency.

At block 68, the process 62 includes depositing a carbon source 70 and one or more additional chemical components 72 (e.g., metallic sources 74 and/or non-metallic sources 76) onto the substrate 66 (e.g., the downhole component, such as those described with respect to FIGS. 1-3). In general, the carbon source 70 and the additional chemical components 72 may be deposited via any suitable technique for producing a film or layer. For example, the carbon source 70 and the additional chemical components may be deposited onto the substrate using chemical vapor deposition (CVD), physical vapor deposition (PVD), plasma-assisted CVD (PACVD), and other similar processes categorized under these broad designations, including hollow cathode plasma ion immersion process. In any case, the deposited carbon source 70 and the one or more additional chemical components 72 may form an amorphous and/or crystalline carbon on the surface of the substrate 66.

The substrate 66 may be part of a downhole component, such as a valve (e.g., ball valve, gate valve, or flapper valve), a packer, sliding sleeves, and a choke, as discussed with respect to FIGS. 1-3. For example, the substrate 66 may be a substantially cylindrical component having a length between 100 mm and 2 m, an inner diameter between 10 mm and 500 mm, and a thickness between 3 mm and 75 mm. In some embodiments, the substrate may be a component produced by an additive manufacturing process and may include a combination of materials (e.g., as discussed below in more detail), including being functionally graded itself.

In certain embodiments, the substrate 66 may be at least partially or entirely made of a polymer, a polymer composite, a metallized polymeric composite, and/or even an elastomeric component. For example, at least 50, 60, 70, 80, 90, 95, 97.5, 99, or 100 percent by volume of the substrate 66 may include a polymer, a polymer composite, a metallized polymeric composite, and/or an elastomeric component. In certain embodiments, the polymer has a tensile strength that is greater than 10,000 psi (e.g., greater than 11000 psi, greater than 14000 psi, greater than 20000 psi, greater than 30000 psi) at ambient temperature (e.g., 75° F. in order to offer typical minimal structural requirements). For example, Table 1 shows several examples of polymer composites that may be employed as the substrate 66 for the carbon rich layer 64.

TABLE 1

Example compositions of the substrate.

| Polymer type | Polymer resin | Filler | Ultimate Tensile Strength (psi) | Elongation (%) | Ref |
|---|---|---|---|---|---|
| Thermoset | Epoxy | Glass filament winding | 40000 | 2 | 1 |
| Thermoset | Epoxy-Dissolvable | Glass fiber: long fiber | 18000 | 2 | 2 |
| Thermoplastic | PPS | Glass fiber | 26000 | 2 | 3 |
| Thermoplastic | PEEK | Glass fiber | 22000 | 3 | 4 |
| Thermoplastic | PEEK | Carbon fiber | 29000 | 2 | 5 |
| Thermoplastic | PEEK | Glass fiber | 22900 | 3 | 5 |
| Thermoplastic | PPA | Glass fiber: long fiber | 28000 | 4 | 6 |
| Thermoplastic | PKE | Glass Fiber | 20000 | 4 | 6 |
| AM Thermoplastic | PEEK | Additives | 14800 | 5 | 6 |
| AM Thermoplastic | PEI | Additives | 11000 | 5 | 6 |
| AM Thermoplastic | PEKK | Additives | 12500 | 3 | 6 |

In some embodiments, the substrate 66 may include one or more metals. For example, the substrate 66 may be at least partially or entirely made of a ferrous-based alloy, a nickel-based alloy, a cobalt-based alloy, a copper-based alloy, an aluminum-based alloy, or a magnesium based-alloy. For example, at least 50, 60, 70, 80, 90, 95, 97.5, 99, or 100 percent by volume of the substrate 66 may include a ferrous-based alloy, a nickel-based alloy as described herein. The substrate may also include a cobalt-based alloy, a copper-based alloy, and even though uncommon, also an aluminum-based alloy or a magnesium based-alloy. In some embodiments, the substrate 66 may include a ceramic material such as a silicon carbide or boron carbide. In some embodiments, the substrate 66 may include both metals and ceramic materials, such as in a cermet. For example, the substrate 66 may include a tungsten carbide cermet, such as a material comprising 60 to 94 wt. % carbides complemented by a corrosion-resistant binder of cobalt, nickel, chromium, among others.

The carbon source 70 is a source precisely including the carbon element and delivering this carbon element to one or more substrates. For example, the carbon source 70 may be a hydrocarbon gas such as methane, ethane, and/or ethyne, an alkyl silane such as trimethyl silane, and/or a metal carbonyl. To produce elemental carbon that would deposit rapidly onto a target substrate, the carbon source gas may be ignited by an AC voltage, which may cause carbon and hydrogen atoms to recombine as a dense carbon rich layer onto the substrate.

The additional chemical components 72 generally include metallic sources 74 (e.g., transition metal sources, main-group metal sources) and nonmetallic sources 76. For example, the metallic sources 74 may include tungsten, titanium, chromium, nickel, iron, and/or cobalt, such as corresponding metal carbonyls, metal hydrides, metal halides, and metal chalcogenides. The nonmetallic sources 76 may include silicon, oxygen, nitrogen, fluorine, and/or chlorine, such as silanes, metal halides, fluorine gas, nitrogen gas, ammonia, and alkylamines.

In certain embodiments, the carbon rich layer 64 includes one or more regions, areas, or locations having a carbon content with a particular amount of $sp^2$ carbon and/or $sp^3$ carbon. Additionally, the carbon rich layer 64 may include one or more dispersed phases that include mixtures of carbon with elements from the one or more additional chemical components 72, such as metal carbides. Further, the carbon rich layer 64 may include combinations of different elements from the additional chemical components 72, such as metal chalcogenides, as discussed in further detail herein.

Further, the carbon rich layer 64 may include a total thickness between 500 nm and 30,000 nm. For example, the total thickness of the carbon rich layer 64 may be between 500 nm and 30,000 nm, between 750 nm and 15,000 nm, between 1000 nm and 5000 nm, or between 1250 nm and 2500 nm. In certain embodiments, the total thickness of the carbon rich layer 64 may include both a thickness of one or more carbon rich layers and a thickness of one or more other layers deposited on the substrate 66, such as a top surface layer, a buffer layer (i.e., a layer introduced to accommodate (e.g., increase the binding strength of) the carbon-rich layer on the substrate), and a dispersed phase layer, as discussed in more detail with respect to FIGS. 5-10. For example, the carbon rich layer 64 may include a plurality of layers, which may include carbon rich layers and optionally non-carbon rich layers, collectively defining a total thickness of the carbon rich layer 64. Buffer layers may include metallic materials, and may also comprise transition-metals applied by PVD, CVD, PACVD, plating, thermal spray or others. The buffer layer may also include non-metallic materials, including polymeric materials and ceramic materials. In order to accommodate a carbon-rich layer onto a surface of the substrate, these layers may include carbon-containing materials, such as tungsten carbide and fluoropolymer.

Figure 5:
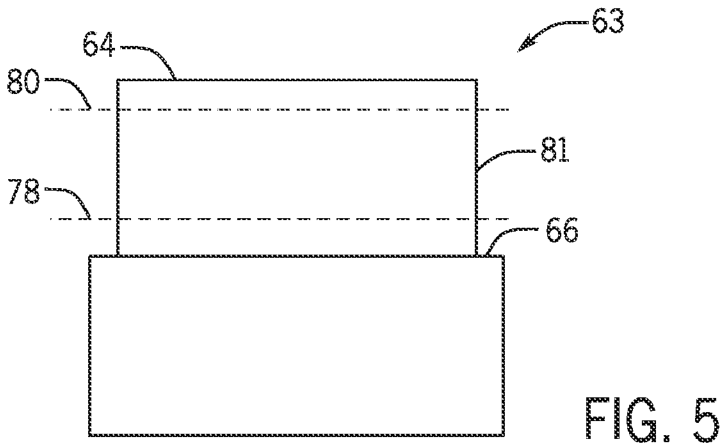
FIGS. 5-10 are cross-sectional views of embodiments of a carbon rich layer on a machine component, in accordance with the present disclosure.

FIG. 5 is a cross-sectional view of an embodiment of the coating 63 having the carbon rich layer 64 deposited on the substrate 66. In the illustrated embodiment, the carbon rich layer 64 has a substantially uniform carbon content. That is, the carbon content within a first portion 78 (e.g., bottom portion or layer) of the carbon rich layer 64 may be substantially similar to the carbon content within a second portion 80 (e.g., top portion or layer) of the carbon rich layer 64. Moreover, in this particular embodiment, the carbon content in a third portion 81 (e.g., intermediate portion or layer) between the first portion 78 and the second portion 80 may be substantially the same, i.e., the carbon content may be substantially uniform throughout the portions 78, 80, and 81.

Figure 6:
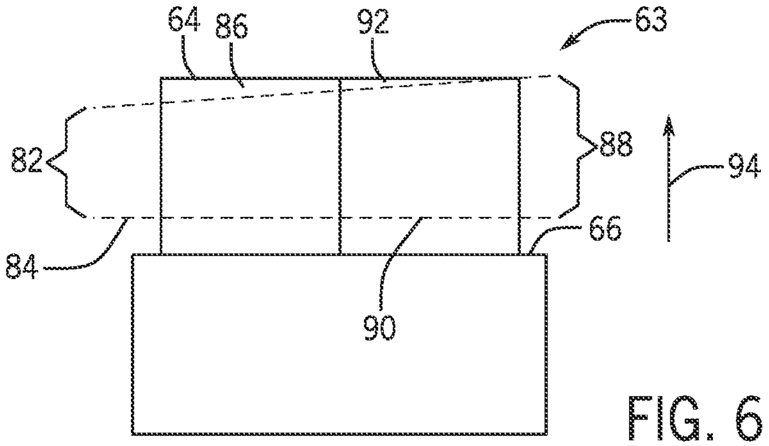

FIG. 6 is a cross-sectional view of an embodiment of the coating 63 having the carbon rich layer 64 deposited on the substrate 66. In the illustrated embodiment, the carbon content of the carbon rich layer 64 varies throughout the carbon rich layer 64, such as progressively changing in carbon content in a direction away from (e.g., perpendicular to) the substrate 66, in a direction along (e.g., parallel to) the substrate 66, or a combination thereof. For example, in the illustrated embodiment, a first region 82 of the carbon rich layer 64 may vary (e.g., linearly or exponentially) from a first bottom portion 84 (e.g., a cross-sectional area or layer) to a first top portion 86 (e.g., a cross-sectional area or layer) of the carbon rich layer 64 within the first region 82. Additionally, a second region 88 of the carbon rich layer 64 may also vary from a second bottom portion 90 (e.g., a cross-sectional area or layer) to a second top portion 92 (e.g., a cross-sectional area or layer) of the carbon rich layer 64 within the second region 88. At least in some instances, the carbon content variation in the first region 82 may be different than the carbon content variation in the second region 88 of the carbon rich layer 64. For example, the carbon content variation in the first region 82 may have a $sp^2/sp^3$ ratio that decreases from the first bottom portion 84 to the first top portion 86 of the first region 82, while the carbon content variation in the second region 88 may have a $sp^2/sp^3$ ratio that increases from the second bottom portion 90 to the second top portion 92 of the second region 88. It should be noted that while only two regions are shown in FIG. 6, the carbon rich layer 64 may include 2, 3, 4, 5, 6, 7, 8, or more regions, each having a respective carbon content variation along a thickness direction 94 of the carbon rich layer 64 (e.g., perpendicular or crosswise direction relative to the surface of the substrate 66). In some embodiments, the first region 82 and the second region 88 may each include a transition metal. In some embodiments, the transition metal composition may vary along the thickness direction 94 of the carbon rich layer 64.

Figure 7:
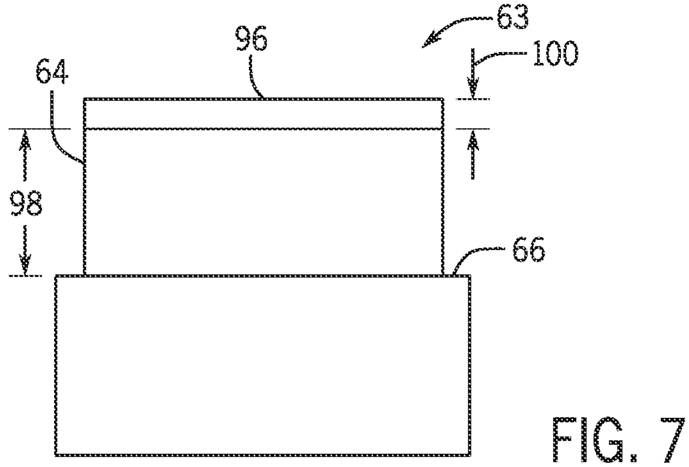

FIG. 7 is a cross-sectional view of an embodiment of the coating 63 having the carbon rich layer 64 deposited on the substrate 66, further illustrating a top surface layer 96 (e.g., a material layer). In the illustrated embodiment, the substrate 66 is coated with a carbon rich layer 64 having a first thickness 98. Additionally, the top surface layer 96 is deposited on top of the carbon rich layer 64 and has a second thickness 100 that is less than the first thickness 98. For example, the second thickness 100 may be less than or equal to approximately 10, 20, 30, 40, or 50 percent of the first thickness 98. The top surface layer 96 generally includes a different chemical composition that the carbon rich layer 64. For example, the top surface layer 96 may include hydrogen between 30 to 40 percent by volume. In some embodiments, the top surface layer 96 may be fluorinated (e.g., including a fluoropolymer). It is presently recognized that the top surface layer 96 with a fluoropolymer may smooth a profile of the carbon rich layer 64, which may prevent defects, such as grain boundary intersects. Additionally, the top surface layer 96 may reduce a number of nucleation sites on the top surface. Further, the top surface layer 96 may be used to provide a layer with a reduced coefficient of friction between the carbon rich layer 64 and a surface in contact with the carbon rich layer 64. At least in some instances, the top surface layer 96 may also be carbon rich. For example, the top surface layer 96 may include a polymer having both $sp^3$ and $sp^2$ carbons. In some embodiments, the surface layer 96 may not include carbon or include only (e.g., greater than 99%) of one type (e.g., hybridization) of carbon, such as $sp^2$ or $sp^3$.

Figure 8:
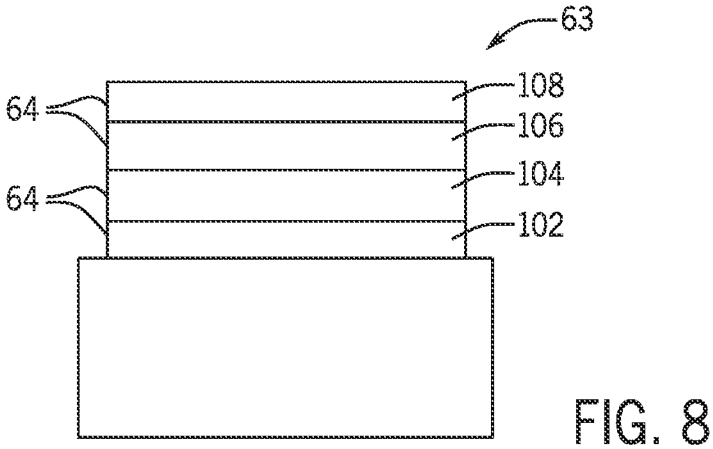

FIG. 8 is a cross-sectional view of an embodiment of the coating 63 having the carbon rich layer 64 deposited on the substrate 66. In the illustrated embodiment, the carbon rich layer 64 includes multiple layers with different carbon content. For example, in the illustrated embodiment, the carbon rich layer 64 generally includes four layers (e.g., a first layer 102, a second layer 104, a third layer 106, and a fourth layer 108) having respective carbon contents (e.g., first, second, third, and fourth carbon contents). The carbon contents of the different layers may be entirely different, or there may be some layers with the same carbon contents. For example, the carbon contents of the different layers may progressively change from one layer to another, or the carbon contents may alternate (e.g., increase and decrease) from one layer to another. For example, the first layer 102 may have a first carbon content different from a second carbon content of the second layer 104. By further example, the third layer 106 may have a third carbon content that is substantially similar to the first carbon content of the first layer 102, and the fourth layer 108 may have a fourth carbon content that is substantially similar to the second carbon content of the second layer 104. In some embodiments, each of the first layer 102, the second layer 104, the third layer 106, and the fourth layer 108 may have a different carbon content.

Figure 9:
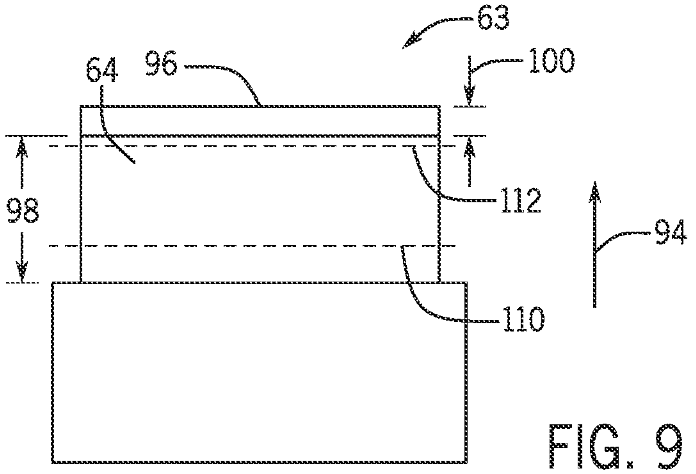

FIG. 9 is a cross-sectional view of an embodiment of the coating 63 having the carbon rich layer 64 deposited on the substrate 66. In the illustrated embodiment, the carbon content of the carbon rich layer 64 varies along the thickness direction 94 and a top surface layer 96 is deposited on top of the carbon rich layer 64. In a generally similar manner as described with respect to FIG. 7, the carbon rich layer 64 may have a first thickness 98 and the top surface layer 96 may have a second thickness 100 different from the first thickness 98. In a generally similar manner as described with respect to the first region 82 or the second region 88, the carbon content of the carbon rich layer 64 may vary along the thickness direction 94. For example, the carbon content may vary (e.g., linearly or exponentially) from a bottom portion 110 (e.g., cross-sectional area or layer) to a top portion 112 (e.g., cross-sectional area or layer) of the carbon rich layer 64.

Figure 10:
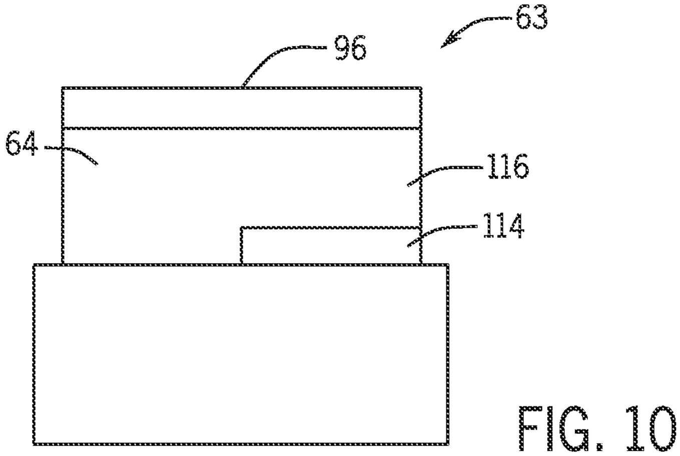

FIG. 10 is a cross-sectional view of an embodiment of the coating 63 having the carbon rich layer 64 deposited on the substrate 66, further illustrating a top surface layer 96, a buffer layer 114, and a dispersed phase layer 116. In general, the top surface layer 96 may be a layer deposited onto the carbon rich layer 64 that has a different composition that the carbon rich layer 64. In general, the top surface layer 96 may include features similar to those described above with respect to FIGS. 7 and 9. The buffer layer 114 may include a metallic buffer layer having one or more metallic buffers, such as nickel, cobalt, and/or chromium, which are deposited onto the substrate 66 before the carbon rich layer 64 is deposited. At least in some instances, one or more atoms of the buffer layer 114 may react with one or more elements (e.g., carbon) in the carbon rich layer 64 to form a dispersion layer. The dispersed phase layer 116 may include components formed from the combination of the carbon source(s) 70, the metallic source(s) 74, and the non-metallic source(s) 76. For example, in an embodiment having tungsten included in the metallic source 74, the dispersed phase 116 may include tungsten carbide (WC). In an embodiment in which the non-metallic precursor 76 includes sulfur and the metallic source 74 includes molybdenum, the dispersed phase layer 116 may include molybdenum disulfide ($MoS_2$). In an embodiment in which the metallic source 74 includes chromium, the dispersed phase 116 may include chromium carbide. In an embodiment in which the metallic source 74 includes tantalum, the dispersed phase 116 may include tantalum carbide.

To further illustrate various embodiments of the carbon rich layer 64, Table 2 provides example embodiments of the carbon rich layer 64 produced by the PACVD process, wherein the carbon rich layer 64 has different carbon contents, among others. For example, example embodiments of the carbon rich layer 64 may have a $sp^3$ carbon content greater than 40%, greater than 45%, greater than 50%, between 40%-60%. Additionally, or alternatively, example embodiments of the carbon rich layer 64 may have a carbon content with a $sp^2/sp^3$ ratio less than 1.5, less than 1.0, less than 0.8, less than 0.7, less than 0.6, or between 1.5-0.6, between 1.5-1.0, between 1.0-0.6, and other ranges represented in Table 2. In examples presented in table 2, the carbon rich layers were produced with a range of thickness between approximately 200 nm (0.2 μm) and 30,000 nm (30 μm), and fall under a broad range of designations. These carbon rich layers include hydrogen and silicon. Some of the carbon-rich layers are single layered and other double-layered. As a result of their different deposition process parameters and compositional differences, carbon layers with average Vickers hardness between 925 and 1550 were produced, indirectly causing a range of desirable coefficient of frictions. Because of the carbon film thickness, hardness was converted from Berkovich nano- and micro-indentation tests conducted with a computerized indenter and reported as average of a minimum of ten measurements. Friction coefficient was measured against a standard stainless-steel ball under dry and dynamic conditions as per a procedure modified from ASTM G99. To quantify the relative amounts of $sp^2$ carbon and $sp^3$ carbon, measurements by Raman spectroscopy and X-ray Photoelectron Spectroscopy (XPS) were complementarily carried out using different procedures. In this example, Raman spectroscopy was first utilized to rapidly characterize specially-designed carbon layers. In the Raman spectroscopy of carbon-rich layers, the measured spectrum produced by scattered laser light depends on the ordering of $sp^2$ sites and indirectly on the fraction of $sp^3$ sites in all amorphous carbons, both hydrogenated and hydrogen-free. Carbon rich layer spectra depict two strong Raman peaks around 1350 $cm^{-1}$ (D-band), and 1580 $cm^{-1}$ (G-band). The G-peak is assigned to in-plane stretching of the $sp^2$ bonded carbon; the D-band is assigned to the breathing mode of aromatic carbon atoms which appears in case of the defects or discontinuities in the network symmetry. The integrated intensity ratio of D-peak to G-peak, referred as "I(D)/I(G)", can be correlated to $sp^2/sp^3$, which decreases with an increase of $sp^3$ fraction in the carbon rich layer. The I(D)/I(G) values for the various carbon rich layers are populated in Table 2 and are seen to vary considerably. The I(D)/I(G) values were extracted from the Raman spectrum of the carbon rich layer after deconvoluting of the peak (in the range of 900 $cm^{-1}$-1800 $cm^{-1}$) to D and G bands. Raman spectrum is recorded from the carbon rich surface using an excitation laser source at 532 nm. The ratios of $sp^2/sp^3$ were also measured by X-ray Photoelectron Spectroscopy (XPS). The C1s XPS peak was recorded from the surface of the carbon rich layer. The C1s peak was deconvoluted to four Gaussian peaks attributed to $sp^3$ (~284.5 eV), $sp^2$ (~285.1 eV), C—O (~286.8 eV) and C═O (~288.4 eV). The $sp^2/sp^3$ was calculated based on their peak areas. The results indicate that there is a correlation between $sp^3$ content by XPS and by Raman spectra, as the $sp^2/sp^3$ shows a positive trend with I(D)/I(G).

TABLE 2

Example carbon rich layer properties and deposition methods.

| | Thickness (μm) | Designation | Composition | Construction | Hardness (HV) | Friction Coefficient | $sp^2/sp^3$ | I(D)/I(G) |
|---|---|---|---|---|---|---|---|---|
| #1 | 30 | a-C:H:Si | C, O, Si | Multi-layer | 925 | 0.08 | 36/47 = 0.77 | 2.84 |
| #2 | 12-15 | a-C:H:Si | C, O, Si | Double layer | 1059 | 0.05 | 30/57 = 0.53 | 2.60 |
| #3 | 1.5 | a-C:H:Cr/W | C, Cr, W | Single layer | 1845 | 0.12 | 33/53 = 0.62 | 1.58 |

TABLE 2-continued

Example carbon rich layer properties and deposition methods.

| | Thickness (μm) | Designation | Composition | Construction | Hardness (HV) | Friction Coefficient | $sp^2/sp^3$ | I(D)/ I(G) |
|---|---|---|---|---|---|---|---|---|
| #4 | 2 | a-C:H:W | C, W | Single layer | 2000 | 0.12 | 33/53 = 0.62 | 1.6 |
| #5 | 0.2 | Polymerlike Carbon films | C, Si | Single layer | 968 | 0.15 | N/A | 0.28 |
| #6 | 15 | a-C:H:Si | C, O, Si | Multi-layer | 1055 | 0.08 | 60/40 = 1.5 | 2.63 |
| #7 | 5-7 | a-C:H:Si | C, O, Si | Double layer | 1547 | 0.05 | 40/49 = 0.82 | 2.15 |

Figure 11:
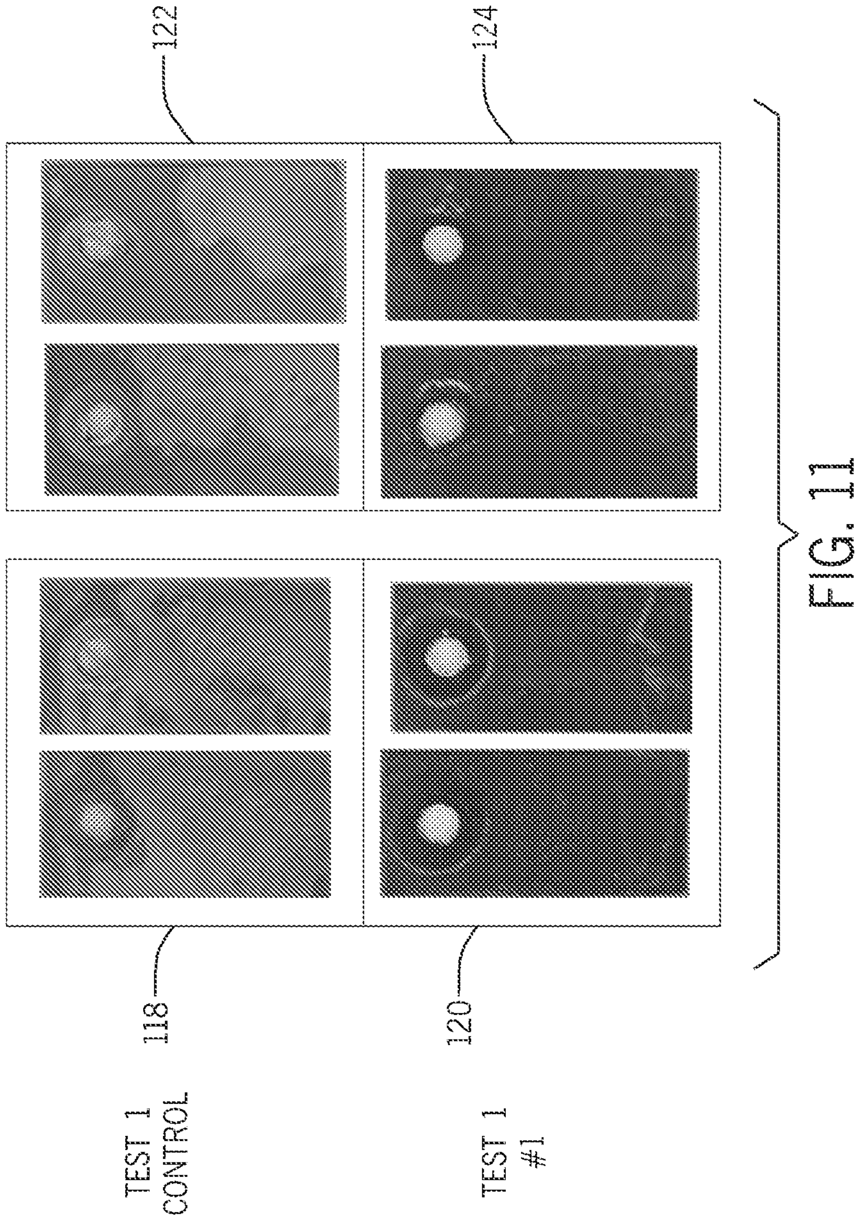
FIG. 11 shows images of samples deposited with a material coating, in accordance with the present disclosure.

The performance of carbon-rich films was measured using a variety of tests on test coupons exposed to both static and dynamic flowing conditions with scale forming brines. For illustration purposes, results from carbonate scale deposition tests have been included to demonstrate that carbon-rich layers as per Table 2 can be effective against scale deposition. Tendency towards scaling can be determined using a number of measures, particularly scale mass gains and scale adhesion strength. Both of these measures have been found to identify carbon-based films resisting scale deposition. In this example, to determine the amount of calcium carbonate scale that would accumulate on carbon rich film test coupons, dynamic scaling tests were conducted using cationic and anionic brine injected into a rotating autoclave (570 rpm). Each of the test coupons, with dimensions 2"×12"×⅛", were suspended in a test fluid comprising a 50:50 mixture of the anionic and cationic brines (Table 3), which was then constantly circulated through the autoclave at a rate of 2.5 milliliters per minute. After addition of the coupons the pressure, temperature, and shear rate were increased to 4500 PSI (using nitrogen), 167° F., and 570 rpm, respectively. The coupons were then aged under dynamic conditions for seventy-two hours. After aging, the test coupons were photographed, dried, and weighed to determine the amount of scale which had accumulated on them. Pictures of 4 test samples (e.g., indicated by arrows 118, 122, 120, and 124), including front (e.g., right) and back (e.g., left) surfaces, are shown in FIG. 11. The test coupons with the carbon rich film referred as #1 (e.g., the images corresponding to arrows 120 and 124) in Table 2 is seen to accumulate significantly less scale than the bare metal (e.g., the images corresponding to arrows 118 and 122), selected to be made of Alloy 718 because of its high corrosion resistance and non-interference with the scale deposition tests.

TABLE 3

Example Brines

| | | |
|---|---|---|
| Cation Brine | | |
| NaCl | Sodium Chloride | 33.00 g/l |
| $CaCl_2 \cdot 2H_2O$ | Calcium Chloride | 36.45 g/l |
| $MgCl_2 \cdot 6H_2O$ | Magnesium Chloride | 3.68 g/l |
| Anionic Brine | | |
| NaCl | Sodium Chloride | 33.00 g/l |
| $NaHCO_3$ | Sodium Bicarbonate | 22.08 g/l |

Figure 12:
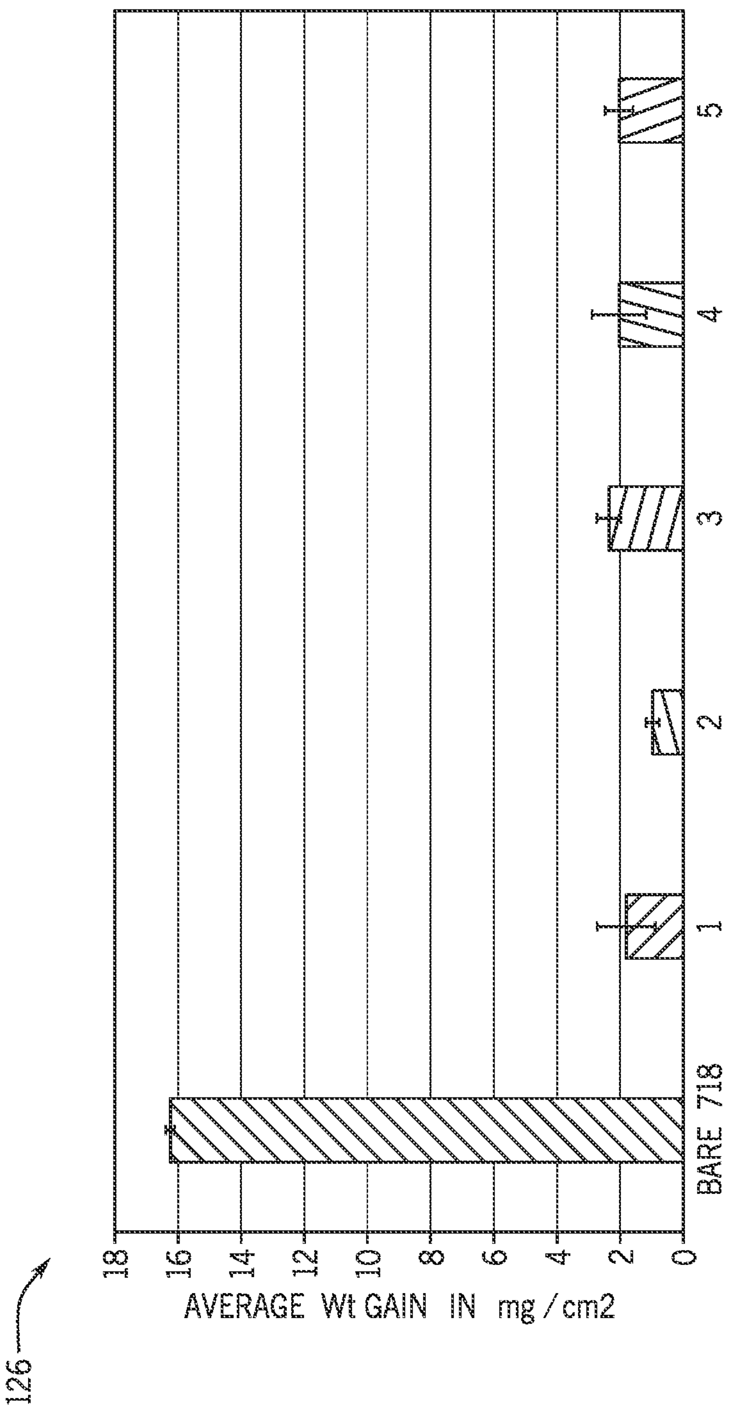
FIG. 12 shows a bar chart of scale dynamic weight gains for samples coated with different material coatings, in accordance with the present disclosure.
Figure 13:
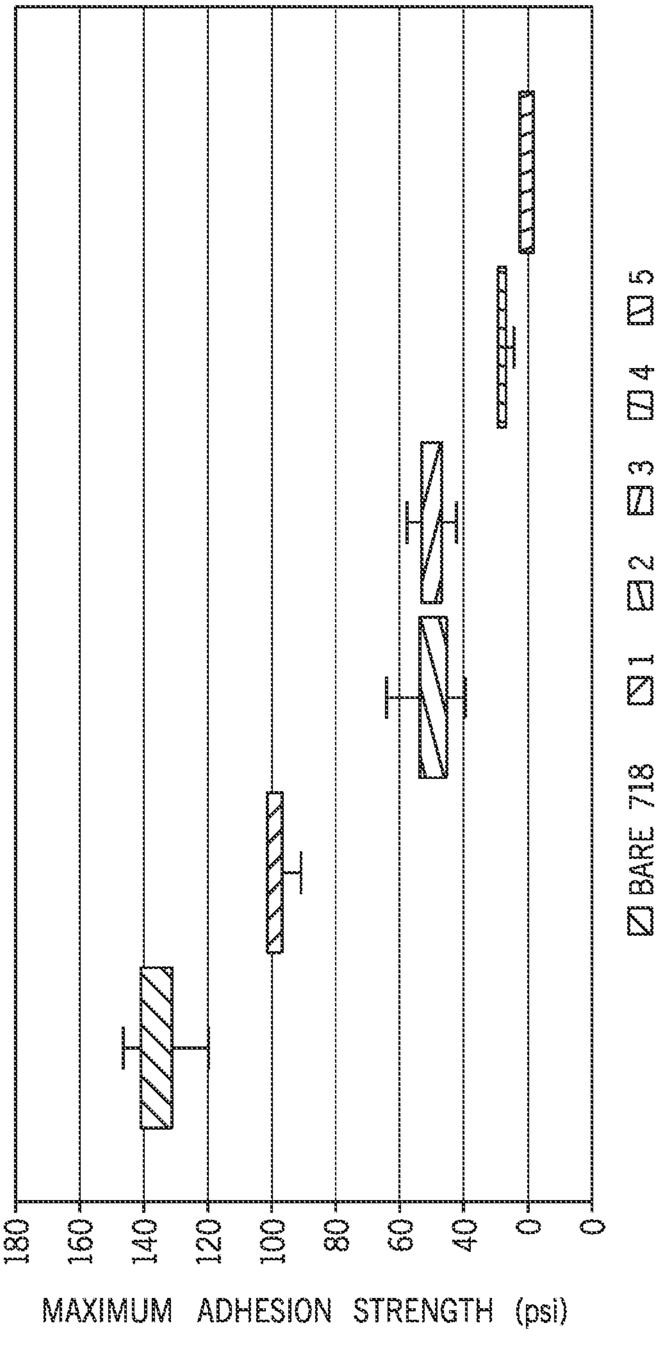
FIG. 13 shows a graph of adhesion strength for the samples coated with different material coatings, in accordance with the present disclosure.
Figure 14:
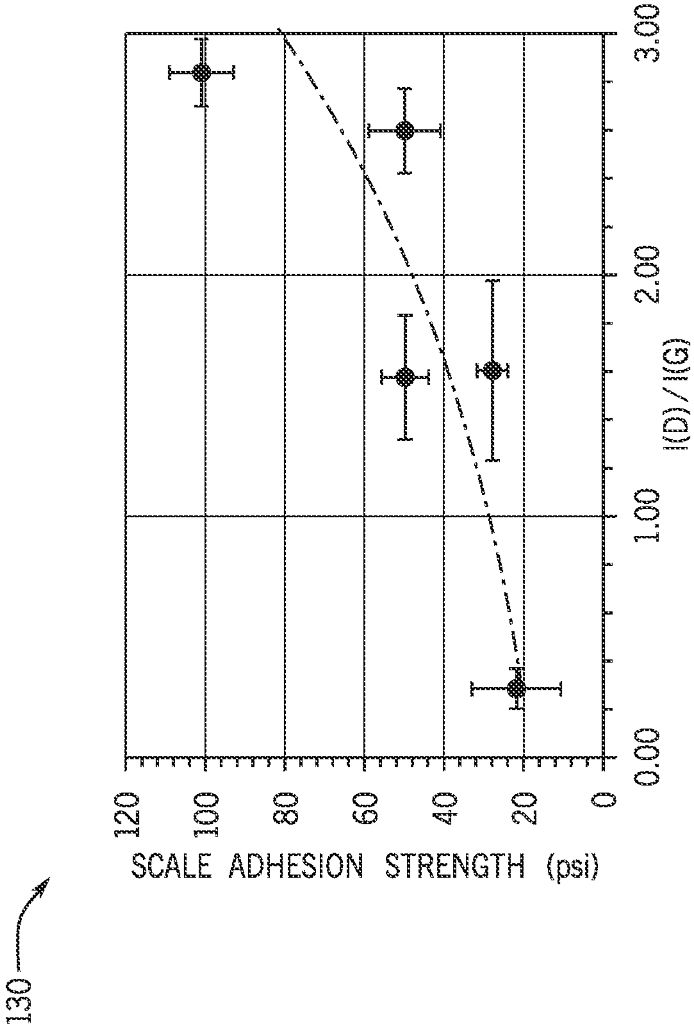
FIG. 14 shows a graph illustrating an observed trend between adhesion strength and the intensity of certain Raman peaks associated with carbon content, in accordance with the present disclosure.

FIG. 12 shows a bar chart 126 depicting observed weight gains for the carbon-rich films to Table 2, compared to a bare metal. The bar chart demonstrates that any of the carbon-rich film of Table 2 resist carbonate scale deposition; however, certain carbon-rich film outperforms others, and to determine the relative ranking of carbon-based films, additional tests and measures become useful, one among such measures is the scale adhesion strength. The adhesion strength test of the scale was carried out on carbon-based films based on a modified ASTM D3359 procedure adapted for scales. In this testing procedure, a probe is attached to pre-calibrated adhesive tape pressed against the scale surface for certain time and then slowly withdrawn from the surface. The adhesion strength was determined by recording the peak force where the scale de-bonded using a pre-calibrated adhesive tape. FIG. 13 shows a graph 128 depicting exemplary adhesion strength scale results after a typical dynamic scale test, also complementing additional and unreported tests-including static scale tests-based on NACE Standard TM0374. The various scale tests repeatedly show that some carbon-rich layers, such as the samples 4 and 5 as mentioned above with respect to Table 2, offer relatively greater resistance towards scale deposits. When these results are put into perspective and analyzed concurrently with Table 2, it may be seen that the carbon-rich layers with relatively low $sp^2/sp^3$ values—correspondingly low I(D)/I(G)—offer less scale adhesion. The observed trend is further illustrated in the graph 130 of FIG. 14. FIG. 14, based on the data reported in Table 2, clearly shows the correlation between carbon-rich layer properties, specifically carbonate scale adhesion and carbon-rich layer electronic structure.

Accordingly, the present disclosure relates to a carbon rich layer 64 with an improved ability to prevent, mitigate, or block scale formation (e.g., scale precipitation) on various equipment, such as downhole components. As discussed herein, it is presently recognized that improved scale mitigation is achieved with a carbon rich layer 64 having one or more regions with a carbon content greater than 40 percent $sp^3$ carbon and/or a $sp^2/sp^3$ ratio of the carbon content is less than 1.5, wherein the improved scale mitigation is substantially better than coatings with a carbon content with less than 40 percent $sp^3$ carbon.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. A system comprising:

a substrate having a tensile strength of at least 10,000 PSI at an ambient temperature;

a carbon rich layer deposited on the substrate, wherein the carbon rich layer comprises a carbon content including $sp^2$ carbon and $sp^3$ carbon, wherein the carbon content has greater than 40 percent $sp^3$ carbon, a $sp^2/sp^3$ ratio of the carbon content less than 1.5, or both, and wherein the carbon rich layer further comprises a dispersed phase layer having an additional carbon content, and the dispersed phase layer comprises one or more metal carbides, and a top surface layer deposited on the carbon rich layer and comprising an organosilicon polymer, a fluoropolymer, or both.

2. The system of claim 1, comprising a metallic buffer layer deposited between the substrate and the carbon rich layer.

3. The system of claim 1, wherein the carbon content decreases along the thickness direction of the carbon rich layer.

4. The system of claim 1, wherein the carbon content increases along the thickness direction of the carbon rich layer.

5. The system of claim 1, wherein the carbon rich layer comprises a thickness between 500 nm and 30,000 nm.

6. The system of claim 1, wherein the carbon rich layer comprises a coefficient of friction that is less than 0.15 against steel, stainless steel, or nickel alloy substrates.

7. The system of claim 1, wherein the substrate is part of a valve.

8. A system, comprising:

a substrate having a tensile strength of at least 10,000 PSI at an ambient temperature; and a carbon rich layer applied to the substrate, wherein the carbon rich layer comprises a first region and a second region, and a carbon content having $sp^2$ carbon and $sp^3$ carbon, and the carbon content has greater than 40 percent $sp^3$ carbon, a $sp^2/sp^3$ ratio of the carbon content less than 1.5, or both, wherein the carbon content increases along a thickness direction of the carbon rich layer in the first region and the carbon content decreases along the thickness direction of the carbon rich layer in the second region; and a top surface layer deposited on the carbon rich layer and comprising an organosilicon polymer, a fluoropolymer, or both.

9. The system of claim 8, wherein the carbon rich layer further comprises a coefficient of friction less than 0.15 against stainless steel.

10. The system of claim 8, wherein the carbon rich layer further comprises between 30% to 40% hydrogen.

11. The system of claim 8, wherein the substrate comprises an electrically actuated downhole component.

12. A system, comprising:

a downhole component formed of a material having a tensile strength of at least 10,000 PSI at an ambient temperature; and a carbon rich layer deposited on the downhole component, wherein the carbon rich layer comprises a first region, a second region, and a carbon content including $sp^2$ carbon and $sp^3$ carbon, and wherein the carbon content has greater than 40 percent $sp^3$ carbon, a $sp^2/sp^3$ ratio of the carbon content less than 1.5, or both, wherein the carbon content increases along a thickness direction of the carbon rich layer in the first region and the carbon content decreases along the thickness direction of the carbon rich layer in the second region; and a top surface layer deposited on the carbon rich layer and comprising an organosilicon polymer, a fluoropolymer, or both.

13. The system of claim 12, wherein the carbon rich layer and the top surface layer deposited on the carbon rich layer are deposited on opposing contacting surfaces of a first part and a second part of the downhole component.

14. The system of claim 12, comprising an electrically actuated downhole component comprising the downhole component.

15. The system of claim 12, wherein the downhole component comprises a valve.

* * * * *